(12) United States Patent
Jongerden et al.

(10) Patent No.: US 8,025,929 B2
(45) Date of Patent: Sep. 27, 2011

(54) METHOD FOR PREPARING FLEXIBLE MECHANICALLY COMPENSATED TRANSPARENT LAYERED MATERIAL

(75) Inventors: Gert Jan Jongerden, Velp (NL); Rutger Schlatmann, Velp (NL); Jan Willem Gaston Mahy, Arnhem (NL)

(73) Assignee: Helianthos B.V., Arnhem (NL)

( * ) Notice: Subject to any disclaimer, the term of this patent is extended or adjusted under 35 U.S.C. 154(b) by 879 days.

(21) Appl. No.: 11/667,983

(22) PCT Filed: Nov. 17, 2005

(86) PCT No.: PCT/EP2005/056039
§ 371 (c)(1),
(2), (4) Date: Nov. 13, 2007

(87) PCT Pub. No.: WO2006/053889
PCT Pub. Date: May 26, 2006

(65) Prior Publication Data
US 2008/0193717 A1    Aug. 14, 2008

Related U.S. Application Data

(60) Provisional application No. 60/635,006, filed on Dec. 13, 2004.

(30) Foreign Application Priority Data

Nov. 19, 2004    (EP) .................................... 04078173

(51) Int. Cl.
*B05D 1/36* (2006.01)
(52) U.S. Cl. ............... 427/419.2; 427/126.1; 427/398.1; 427/108; 427/402; 427/419.1

(58) Field of Classification Search ............... 427/248.1; 136/243–265
See application file for complete search history.

(56) References Cited

U.S. PATENT DOCUMENTS

| 4,542,257 | A | * | 9/1985 | Fraser et al. .................. 136/251 |
| 4,952,783 | A | | 8/1990 | Aufderheide et al. |
| 5,907,383 | A | | 5/1999 | Kurihara et al. |

(Continued)

FOREIGN PATENT DOCUMENTS

DE        32 45 611        7/1983

(Continued)

OTHER PUBLICATIONS

Cairns, Darran R. et al., "Strain-dependent Electrical Resistance of Tin-doped Indium Oxide on Polymer Substrates," *Applied Physics Letters*, vol. 76, No. 11, pp. 1425-1427, (2000).

(Continued)

*Primary Examiner* — David Turocy
(74) *Attorney, Agent, or Firm* — De Vries & Metman

(57) ABSTRACT

The invention pertains to a method for preparing a flexible mechanically compensated layered material comprising a transparent carrier both sides of which are at least partly covered with a transparent inorganic material, comprising the consecutive steps of a) providing two temporary substrates; b) applying a transparent inorganic material layer onto each of the temporary substrates; c1) applying a transparent carrier onto the transparent inorganic material layers; or c2) applying a polymerizable precursor for a transparent polymerized carrier onto the transparent inorganic material layers followed by polymerizing the polymerizable precursor to the transparent carrier; and d) removing the temporary substrates.

15 Claims, 1 Drawing Sheet

U.S. PATENT DOCUMENTS

Figure 1:
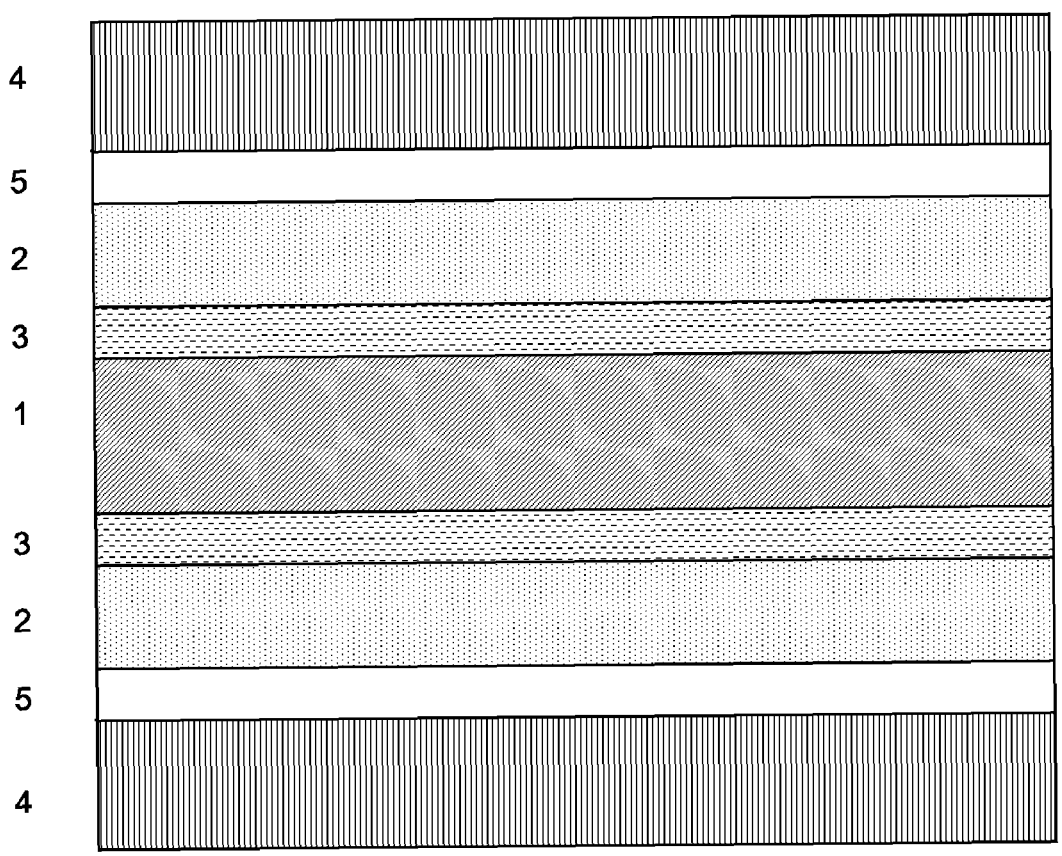

| | | | |
|---|---|---|---|
| 6,184,057 B1 * | 2/2001 | Van Andel et al. | 438/66 |
| 2002/0119307 A1 | 8/2002 | Boire et al. | |
| 2003/0124392 A1 | 7/2003 | Bright | |
| 2004/0014299 A1 | 1/2004 | Moriceau et al. | |
| 2004/0033369 A1 | 2/2004 | Fleming et al. | |
| 2005/0056312 A1 * | 3/2005 | Young et al. | 136/258 |
| 2005/0109389 A1 * | 5/2005 | Middelman et al. | 136/256 |

FOREIGN PATENT DOCUMENTS

| | | |
|---|---|---|
| EP | 0 675 157 | 10/1995 |
| EP | 0 948 004 | 10/1999 |
| EP | 1 460 643 | 9/2004 |
| JP | 1 119073 | 5/1989 |
| JP | 03 256737 | 11/1991 |
| JP | 04 344236 | 11/1992 |
| JP | 6 232437 | 8/1994 |
| JP | 06238853 | 8/1994 |
| JP | 6 251632 | 9/1994 |
| JP | 07 175055 | 7/1995 |
| JP | 10 329257 | 12/1998 |
| JP | 2001-501035 | 1/2001 |
| JP | 2001096661 | 4/2001 |
| JP | 2001328197 | 11/2001 |
| JP | 2002052636 | 2/2002 |
| JP | 2002-508573 | 3/2002 |
| WO | WO98/13882 | 4/1998 |
| WO | WO99/49483 | 9/1999 |
| WO | 03/075351 | 9/2003 |
| WO | WO 03075351 A2 * | 9/2003 |
| WO | 2004084282 | 9/2004 |
| WO | WO 2004084282 A1 * | 9/2004 |

OTHER PUBLICATIONS

Hartnagel, H. L. et al., "Transparent Conducting Oxides: Basic Properties," *Semiconducting Transparent Thin Films,* Chapter 1, (1995).

International Search Report, PCT International Patent Application No. PCT/EP2005/056039, dated Feb. 16, 2006.

European Search Report, dated Apr. 25, 2005.

Japanese Office action for related patent application No. 2007-541956, mailed Jan. 11, 2011.

Translation of the relevant parts of H07-175055 (reference 3).

Translation of the relevant parts of H01-213991 (reference 4).

Taiwanese Office action for related patent application No. 094140709, mailed Apr. 11, 2011.

* cited by examiner

METHOD FOR PREPARING FLEXIBLE MECHANICALLY COMPENSATED TRANSPARENT LAYERED MATERIAL

REFERENCE TO RELATED APPLICATION(s)

This application claims the benefit of U.S. Provisional Application No. 60/635,006 filed on Dec. 13, 2004.

The present invention relates to a method for preparing a flexible mechanically compensated transparent layered material comprising a transparent carrier both sides of which are at least partly covered with a transparent layer of an inorganic material, and to said flexible mechanically compensated layered material thus obtained.

Transparent layered materials comprising a transparent carrier both sides of which are at least partly covered with a transparent layer of an inorganic material are known in the art.

JP 07175055 describes a plastic substrate provided onto both sides with a transparent conductive film. Then, the layer on one side of the substrate is removed while the layer on the other side of the substrate is patterned. The use of two layers has the advantage that warping of the plastic substrate is prevented.

U.S. Pat. No. 5,907,383 describes a transparent conductive substrate comprising a transparent resin layer provided onto both sides with a metallic oxide thin film layer which may be a zinc oxide layer. A transparent electrode layer is set up onto the front face of one of the oxide layers.

JP 6238853 describes a resin sheet both sides of which are covered with a transparent oxide coating, with a transparent electrode layer being set up onto the front face of one of the oxide layers.

It was found that prior art layered materials containing tin-doped indium oxide (ITO) on polymer films usually show catastrophic failure in their electric performance at tensile strain levels above 2-2.5%. This is reported for instance by D. R. Cairns et al. (Applied Physics Letters, vol. 76, 11, pp. 1425-1427, 2000) In such layered structures repeated loading (fatigue) at strain levels of the order of 0.3-0.5% already leads to initiation and growth of cracks and thus to a decrease of electric conductivity. The rapid formation of cracks in the inorganic layer at increasing tensile strain is associated with the brittle nature of the ceramic oxide layer relative to the polymer carrier, and on the adhesion between and thickness of both layers. The interfacial adhesion in general can be influenced by the application process of the transparent inorganic material on the polymer carrier, which usually involves direct deposition of the inorganic material onto the polymer carrier using e.g. physical or chemical deposition techniques.

Many uses can be envisaged for transparent layered materials comprising a transparent carrier both sides of which are at least partly covered with a transparent layer of an inorganic material. If the transparent inorganic material is a specific oxide of for instance tin, zinc or indium, a transparent electrically conductive or semi-conductive inorganic material is obtained, which can be used in electronic devices. At a suitable thickness, these materials are furthermore known to be optically transparent, infrared light (heat) reflective, and ultraviolet light absorbing. Further, the presence of a transparent inorganic layer may improve the thermal, mechanical and chemical properties of the carrier as to its corrosion and heat resistance, scratch resistance, etc., which may make it possible to extend the lifetime of e.g. transparent polymer sheets.

It is pointed out that these attractive properties or a combination thereof are not only found in inorganic layers, the composition of which contains a range of (semi) conductive materials, but also includes insulating inorganic materials such as e.g. silica, as well as nitrides and oxynitrides, such as titanium nitride, in fluorides, carbides, and in silicides. In the context of the present invention the word "transparent" means transparent to visible light. The transparent layered material preferably has a transmittance of at least 75% in the 390-650 nm wave length range, more preferably a transmittance of at least 80%, most preferably at least 85% relative to the transparent carrier which is not covered by a transparent inorganic material. A comprehensive review of a sub-class of semiconducting inorganic materials is given for instance in "Semiconducting Transparent Thin Films" by H. L. Hartnagel, A. L. Dawar, A. K. Jain and C. Jagadish, Institute of Physics Publishing Ltd, 1995, ISBN 0 7503 0322 0, Bristol, UK.

According to the above-mentioned references, the transparent layered material can be prepared by deposition of the transparent inorganic material layer directly onto a polymer carrier. This places requirements on the carrier as to its resistance to the deposition conditions of the transparent inorganic material layer, often necessitating the selection of the carrier to meet the requirements to create the inorganic material layer, or the selection of the inorganic material layer and its deposition properties to meet the properties of the carrier. This may necessitate the selection of costly or otherwise unattractive materials. Further, due to the mismatch in thermal expansion coefficients of the various possible inorganic and organic layers, the resulting layered material will tend to warp under changing temperature conditions which becomes especially important if the temperature of deposition of the inorganic material layer and the temperatures of further processing steps and end-use are different. Obviously, this warping also depends on the relative thicknesses of the different layers of the transparent layered material. Moreover, due to a lack of sufficient interfacial adhesion in the layered material, thermally or mechanically generated crack formation and propagation in the inorganic layer may result in (partial) delamination of the inorganic material layer from the transparent carrier on which it is deposited. This for instance accounts for the catastrophic failure at elevated strains in ITO layers as mentioned above.

There is therefore need for a method for preparing layered materials without becoming warped and with improved interfacial properties between the layers. Such method would make the selection of the carrier independent from the selection of the transparent inorganic material. The present invention now provides such a method.

It is well-known in the art that deposition conditions during the formation of the layer of transparent inorganic material have a large impact on the resulting optical, thermal, mechanical properties. For example, much of the aforementioned attractive properties in some metal oxides, such as electrical and optical properties, are directly related to the nucleation and growth conditions of a microcrystalline structure of the inorganic material layer. For instance the size, shape, orientation and interconnection of individual crystallites formed during or after the deposition process strongly determines the mechanical properties, the electrical (semi) conductivity, homogeneity (and stoichiometry) of the inorganic material layer at a given thickness as well as the optical transmission, IR reflection, UV absorption and light scattering properties of the layered material. The desired thickness of the inorganic layer depends on a number of factors, e.g. optical transparency, required conductivity or mechanical properties, but typically is within a range of a few nanometers to a few micrometers. Generally, higher temperature growth conditions are needed to form better-defined layers consisting of larger crystallites, which in turn lead to improved properties. As typical temperatures may be well over 250° C. for such conditions, many polymeric transparent carriers are unsuitable for direct deposition of the transparent inorganic material layer. Moreover, the generally occurring mismatch in thermal expansion coefficients between carrier and inorganic material, in combination with a high temperature deposition process may create non-flat layered materials, which are undesirable for further processing or use in many applications. As a consequence, deposition conditions for transparent inorganic materials with optimal properties are conflicting with those required to obtain a flat layered transparent material, using conventional (direct) deposition methods.

The inorganic material may be an oxide, nitride, oxynitride, fluoride, carbide, silicide, and the like. Preferably the inorganic materials are microcrystalline. Most preferably the inorganic material is a microcrystalline oxide. Herein further in the description only oxides are described, but the same applies for other inorganic materials as well. The term "microcrystalline" refers to the preferred nature of the layer of inorganic material, which consists of crystals which nucleate and grow in such a way that an interconnected, possibly oriented array of microcrystals is formed, separated by grain boundaries or possibly less-ordered, e.g. amorphous, regions. The size, shape and orientation of the crystals largely depends on the deposition conditions and may be influenced by the nature of the substrate onto which they are deposited. Generally, larger crystal sizes will result from higher deposition temperatures and the length of the period during which crystal growth can occur, e.g. annealing conditions.

It was now found that application of high temperature crystal growth method for the transparent oxide, using a temporary substrate, preferably a metal substrate (for instance an aluminum substrate) and subsequent transfer of the transparent oxide onto a transparent carrier results in a compressive state of the transparent oxide layer. Consequently, significantly higher tensile strain levels can be induced on the layered material prior to the onset of crack formation and subsequent failure as compared to non-compressed inorganic layers. This is advantageous for the mechanical properties of the layered material, e.g. for applications or processing in which flexibility is desired or required. By combining the transparent carrier material at both sides with a transparent oxide, a compensation for possible warping is obtained and results in a flat configuration at normal processing and operating temperatures.

To this end, the present invention pertains to a method for preparing a flexible mechanically compensated layered material comprising a transparent carrier both sides of which are at least partly covered with a transparent inorganic material, comprising the consecutive steps of
a) providing two temporary substrates;
b) applying a transparent inorganic material layer onto each of the temporary substrates;
c1) applying a transparent carrier onto the transparent inorganic material layers; or
c2) applying a polymerizable precursor for a transparent polymerized carrier onto the transparent inorganic material layers followed by polymerizing the polymerizable precursor to the transparent carrier; and
d) removing the temporary substrates.

Various embodiments can be envisaged for this method, in particular for the step of combining the transparent carrier with the transparent oxide layers.

In one embodiment, the transparent carrier is applied by laminating a transparent polymer carrier foil or film between the two transparent oxide layers, optionally sequentially, but preferably simultaneously. If so desired a transparent adhesive is provided onto one or both sides of the transparent carrier foil or film.

In another embodiment of the method according to the invention, the transparent carrier is applied as a polymerizable carrier between the two transparent oxide layers, followed by polymerizing the polymerizable carrier to form the transparent carrier. Depending on the carrier composition the polymerization can be carried out by light, heat, or in any other way known to the skilled person. In a variation on this embodiment the transparent carrier is applied as a polymerizable carrier onto one oxide layer, followed by polymerizing the polymerizable carrier to form the transparent carrier, and laminating the other oxide layer onto the carrier.

The polymerizable carrier should become transparent after polymerizing, and may as such be transparent or not transparent. According to this method the transparent oxide layers are adhered to the transparent carrier by mechanical, chemical and/or physical bonding with the polymerizable carrier, which therefore acts as an adhesive between the transparent oxide and the transparent carrier.

Both the temporary substrate itself and the method to remove it (suitably by means of dissolving or etching) can be selected by the man skilled in the art by using standard procedures without great difficulty.

In another embodiment of the method according to the invention, the transparent carrier is applied as a polymer melt, e.g. applied as a curtain, between the two transparent oxide layers, in the nip of two rollers and subsequently cooled.

In such a case no adhesive is necessary, and a one step process is obtained.

The temporary substrate according to the present invention is preferably a metal or metal alloy foil or film. The main reason for this is that such foils or films generally are able to withstand the highest temperatures during further processing, suffer little from evaporation, and can be removed relatively easily using known etching techniques. Moreover, many of these metal foils or films meet the objective of low cost material. Finally, the coefficient of thermal expansion of metal foils is typically much larger than that of the transparent oxide, which results in a transparent oxide layer in a suitable compressive state after deposition at elevated temperature and subsequent cooling of the temporary substrate to ambient conditions.

Suitable metals include steel, aluminum, copper, iron, nickel, silver, zinc, molybdenum, and alloys or multilayers thereof. Inter alia for economic reasons it is preferred to employ Fe, Al, Cu, or alloys thereof. Suitable etching techniques are known in the art and, while different for each metal chosen, can be selected by the man skilled in the art using due skill. Preferred etchants include acids (Lewis acids as well as Brønstedt acids), e.g., in the case of copper as a metal foil, it is preferred to use $FeCl_3$, nitric acid, or sulfuric acid. Aluminum can also be efficiently removed by, e.g., caustic soda (NaOH).

For the sake of removability, the temporary substrate preferably is as thin as possible. Of course, it should still allow applying further layers onto it, and keeping these together, but this generally will not require thicknesses above 500 µm. Preferably, the thickness is 10 to 300 µm. Depending on the modulus of elasticity, the majority of materials will require a minimum thickness of 10 µm, in which case the more preferred thickness range is 10 to 250 µm, most preferably 70 to 150 µm. The aluminum foil containing the inorganic material may be cleaned with demineralized water in order to remove loose particles.

Suitable materials for the transparent carrier layer will be evident to the skilled person. They include polymers like polyethylene terephthalate (PET), poly(ethylene-2,6-naphthalene dicarboxylate), polypropylene, polyethylene, polycarbonate, polymers of methylmethacrylate, acrylate amides, and styrene vinylidene, epoxy polymers, and polyvinyl chloride. As indicated above, the transparent carrier can be applied in the form of a carrier film, or in the form of a polymerizable carrier, which is a precursor for the transparent carrier. Application in the form of a film, which may be a fully cured film or a semi-cured film is generally preferred. The thickness of the carrier should preferably lie within the range of 25 µm to 10 mm. More preferred ranges are 50 µm to 5 mm and 75 µm to 1000 µm. The bending stiffness (within the framework of the present invention being defined as the modulus of elasticity ('E' in N/mm$^2$) of the material multiplied by the thickness ('t' in mm) of the carrier cubed: $E \times t^3$) preferably is larger than $16 \times 10^{-2}$ Nmm and will usually be smaller than $15 \times 10^6$ Nmm.

The choice of an adhesive layer to be applied between the transparent carrier and the transparent oxide depends on the type of transparent carrier and the transparent oxide as well as on the envisaged application of the layered material. As indicated above, a polymerizable material which is precursor for a transparent polymer carrier can be considered as intrinsic adhesive comprising non-polymerized moieties which at the interface between the precursor and the transparent oxide can act as chemical or physical adhesion promoter.

A transparent carrier which is heated to above its softening point during application of the transparent oxide may result in a transparent material with appropriate interfacial adhesion between the carrier and oxide layers, due to mechanical anchoring of the oxide layer onto the carrier. This anchoring requires a sufficiently rough surface structure of the oxide layer on a microscopic scale. The high temperature crystal growth conditions are well-known to a person skilled in the art to yield a sufficient degree of micro-roughness for this purpose.

It is preferred, however, to use an additional adhesive layer between at least one of both oxide layers and the carrier foil. This adhesive can be chosen in such a way as to match chemical, physical, or mechanical adhesion towards the transparent oxide layer on the one hand, and chemical, physical, and diffusion/interpenetration based adhesion to the carrier layer on the other hand. Suitable organic single- or multicomponent adhesives can be selected by a person skilled in the art, e.g. epoxy resins on the basis of bisphenol A or F, or other polyols such as aliphatic glycols, novolacs and epoxides with cycloaliphatic backbone and reactive diluents like butyl glycidyl ether, cresyl glycidyl ether, 2-ethylhexyl glycidyl ether, and the like. These resins can be converted into thermosets with the desired mechanical, electrical, and optical properties by curing (polyaddition) with commonly used curing agents like polybasic acids and acid anhydrides, mono and polyamines, amino resins, polyamides, polyurea, polythiols, polymercaptanes, Lewis acids, and the like. Suitable acids are phthalic anhydride, (methyl)tetrahydro phthalic anhydride, trimellitic anhydride, (methyl)hexahydrophthalic anhydride, nadic methyl anhydride, dodecyl succinic anhydride, and the like. Examples of polyamides are Versamid® from Cognis (formerly Henkel) and Ancamide® from Air Products.

Suitable amines are diethylamino propylamine, diethylene triamine, diethyl-toluene diamine, triethylene tetramine, tetraethylene pentamine, polyethylene polyamine, 1,2-cyclohexanediamine, aminoethyl piperazine, metaphenylene diamine, imidazoles, and their derivatives, dicyandiamide, diaminodiphenyl sulfone. The epoxy/amine-reaction can be catalyzed by incorporation of alcohols, phenols, acids, tertiary amines, and sulfur containing compounds. In view of the color of the adhesive purification of the amines may be necessary, e.g. by distillation.

Suitable thiols are aliphatic and aromatic (poly)thiols like 1,2-ethanedithiol, 1,3-propanedithiol, 1,4-butanedithiol, pentaerythritol tetramercaptoacetate, 1,2-ethanediol bismercaptoacetic acid, 1,4-benzenedimethanol dimercaptoacetic acid, 1,3-benzenedimethanol dimercaptoacetic acid, 1,2-benzenedimethanol dimercaptoacetic acid, 1,4-benzenedimethanethiol, 1,3-benzenedimethanethiol, 1,2-benzenedimethanethiol, and the like.

Another classes of resins comprise (poly)hydroxy-functional resins like hydroxyl terminated polyesters, polyether diols, polyols, e.g. Desmophen®, that are cross-linked with polyisocyanates or polyisocyanurates, e.g. Desmodur®. In both cases solvents optionally used to apply the adhesive films have to be evaporated prior to curing.

Other adhesives, e.g. acrylic polymers or maleimide (co) olymers, can be used provided that they survive the etching conditions. Proper selection of the adhesive results in reduced delamination of the oxide layer from the transparent carrier and in a reduction of crack formation in the oxide layer on mechanical loading. In this way, attractive properties of the oxide layer, like electrical conductivity and barrier properties, become less sensitive to mechanical (fatigue) loading.

It is noted that the selection of a suitable adhesive additionally allows introducing added functionality to the transparent layered material, such as e.g. matching the refractive index difference between the transparent oxide and the transparent carrier in such a way as to tailor the optical light scattering properties thereof. For example, for a transparent conductive oxide of tin, indium, or zinc, typical refractive indices in the optical wavelengths are between n=1.8 and 2, whereas for a polymeric carrier foil typically n=1.5. An adhesive layer with a matched refractive index between n=1.5 and 1.8, preferably between 1.64 and 1.73, results in reduced light scattering and increased transmission of light in optical wavelengths. It is known in the art that adhesives with adjustable refractive index can be obtained, e.g. n=1.43 to 1.62 (epoxy type); 1.42 to 1.70 (acrylic type).

The transparent oxide layer can be deposited in a known manner, e.g., using Metal Organic Chemical Vapor Deposition (MOCVD), sputtering, Atmospheric Pressure Chemical Vapor Deposition (APCVD), plasma enhanced PECVD, spray pyrolysis, evaporation (physical vapor deposition), electrodeposition, screen printing, sol-gel processing, etc. For a number of the aforementioned attractive properties, e.g. electrical, optical and mechanical, of the transparent oxide layer, the layer should consist preferably of microcrystalline array. The nature of this arrangement and the size and shape of the crystals will strongly influence the electrical and optical properties of the layer. Moreover, the homogeneity and isotropy of the crystalline arrangement will influence the cohesion and mechanical behavior. The nucleation and growth conditions used in the selected deposition process are important parameters for the resulting crystalline arrangement of the transparent oxide. Examples of materials suitable for use in the transparent oxide layer are tin-doped indium oxide (ITO), zinc oxide, aluminum- or boron-doped zinc oxide, silicon oxide, cadmium oxide, tin oxide and fluorine- or antimony-doped tin oxide. The nature of the transparent oxide will depend on the intended use of the material. If the oxide layer is mainly intended for protective purposes it may be, e.g., a cheap material like silica. On the other hand, if it is to be applied in electrical applications, electrically conductive materials like ITO and F- or Sb-doped tin oxide may be preferred. If preferred, the transparent oxide layers may be applied in a pattern, or may be patterned after application thereof onto the temporary substrate, for instance by etching.

Depending on the intended use of the transparent layered material, further layers may be incorporated into the layered material. This can be done either by applying them onto one or both transparent oxide layers after the temporary substrate has been removed, or by applying them onto the temporary substrate before or after the oxide layer is applied, i.e. onto the temporary substrate or onto the oxide layer.

Examples of additional layers include layers of a transparent conductive oxide, if the layered material is to be used in electronic apparatuses, photovoltaic layers or solar cells, back electrodes if the layered material is to be used in a solar cell sheet, cover layers for protection, titania layers for anti-dust, etc. Whether the additional layers will be applied onto the temporary substrate before or after the transparent oxide is applied, or onto the transparent oxide after the temporary substrate has been removed will depend on the circumstances, mainly on the properties of the additional layer. Preferred additional layers are at one or both sides of the material and include layers having specific electronic, optical, mechanical, or chemical properties, such as matching the work-function of a transparent conductive oxide, improving the microflatness of transparent conductive oxide surfaces, notably by compensating for surface defects potentially leading to electrical shunts, improved barrier properties for e.g. water (vapor) and oxygen diffusion, refractive properties for anti-reflection or anti-glare applications, anti-fouling properties for corrosive liquids and aerosols or dust, compliance improving polymer layers to limit the propagation and electronic effects of crack formation in the transparent oxide during mechanical strains, etcetera.

Typical layers known in the art are conductive polymers, e.g. PEDOT:PSS, which combines the work function-enhancement, shunt-protection and compliance layer properties required for electronic applications in e.g. flat panel display devices, Barix™ multilayer systems of alumina and polymer sandwich layers to enhance barrier properties of e.g. organic light emitting diode (OLED-) devices, and fluoropolymer encapsulant layers for hydrophobation properties.

Depending on the actual composition of the transparent layered material, further processing steps may be carried out. For example, if the transparent layered material consists of two transparent oxide layers (at least one of which is a conductive oxide) on a transparent carrier which is to be used in passive or active matrix information display applications, it may be desired to pattern the conductive oxide layer. The other transparent oxide layer may be left on to provide scratch protection or to act as a barrier layer, but it may also be removed. In that case, its presence serves to provide mechanical stability to the transparent layered material during patterning. The transparent layered materials of this invention do not show catastrophic failure of, e.g., electrical properties at strain levels of 2% as in conventionally prepared layered materials, due to their intrinsic compressed state, and can be used for various types of display applications, which require different front and backplanes. For TFT-LCD a backplane can be patterned transparent conductive oxide (TCO) with addressable TFT (thin film transistors, one per pixel), whereas a front plane can consists of TCO film on a transparent carrier (ground layer) with integrated color filters. The excellent conductivity combined with optical transparency of the layered materials makes them suitable for large area screens and substrates for electroluminiscent stacks, which usually require high voltage (100-400 V) and preferably low resistivity operating conditions. The electrical conductivity of the transparent inorganic material layer is obtained giving a transparent conductive oxide layer, preferably having an average size of the crystallites in the 180 to 220 nm range (as measured by Scanning Electron Microscopy and Atomic Force Microscopy) and a sheet resistance below 10 Ohms/square.

The method according to the invention described hereinabove not only combines the specific desirable optical, mechanical, and electrical properties of a high temperature grown transparent oxide layer with the versatility of combining such layers with a transparent carrier selected for its specific purpose in the layered material, irrespective of the process conditions required for the transparent oxide, but the method is also very well suited for low-cost manufacturing processes using unit operations well-known in the art, such as deposition methods, lamination methods, etching, and patterning methods. More particularly, the method according to the invention can be carried out in a roll-to-roll or a sheet-to-sheet process, using a sequence of unit operations in which rolls or sheets of temporary substrate material, carrier foil, adhesive and/or polymerizable precursor are deposited, applied, laminated, patterned and etched in a semi-continuous way. The potential of e.g. roll-to-roll processability of layered materials in e.g. flexible display applications, manufacturing of heat-reflecting polymer foil (e.g. so-called "smart window" applications), so-called "electronic paper" systems, and transparent carriers with functionalized surfaces (hardcoats, anti-reflection, anti-scratch, anti-fouling and the likes) is well-known in the art. The transparent layered material manufactured in a roll-to-roll process using the method according to the invention, evidently and intrinsically requires a certain "flexibility" allowing processing and storage under mechanical (e.g. bending, tensile) and thermal (e.g. heating, cooling, and conditioning) strains, whilst yielding suitably sized and flat "sheets" of layered material for further processing and/or end-use application. Hence, in order to be suitable for a roll-to-roll manufacturing process and/or a flexible end-use application, the layered material should not only be sufficiently thin, but preferably also be mechanically compensated and sufficiently robust under strain. The transparent layered material obtained using the method according to the invention has the intrinsic advantage of being flexible and robust and allows a large degree of freedom as to the overall thickness.

Therefore, it is preferred for the method according to the invention to be carried out in a roll-to-roll or sheet-to-sheet method. The term "flexible" as used herein means that the material has sufficient flexibility to be suitable for use in such methods, which is evident to the skilled man. The term "flexible" as used in the envisaged end-use application of the layered material, such as for instance in a "flexible display" application, may have different meanings, including moldability during manufacturing the system (e.g. display), rollability or even foldability during use of the system. Obviously, more stringent requirements to the overall mechanical behavior of the layered material are needed if repeated strains or higher radii of curvature or higher temperature molding conditions are used.

In the method according to the invention, the transparent oxide, preferably obtained by a high temperature growth process, is combined with the transparent carrier, e.g. a transparent polymer foil, possibly (but not necessarily) using an adhesive layer matching the transparent oxide layer and the transparent carrier foil. This method of combination has clear advantages relative to a conventional "direct" deposition method of a transparent oxide onto a transparent carrier.

Firstly, the morphology of the surface and interface of the transparent oxide layer is "inverted" in the layered material prepared according to the method of the invention, relative to the conventional "direct" deposition method. The interface between the temporary substrate and the transparent oxide layer grown thereupon essentially reflects the smoothness of the temporary substrate's surface. This surface can for instance be polished in case of a metal or glass surface. Secondly, the surface of the transparent oxide layer as-grown on the temporary surface reflects the roughness associated with the high temperature crystal growth conditions. This surface structure can be influenced by controlling the nucleation and growth conditions in the particular deposition process, but essentially the external surface of the as-deposited transparent oxide layer has an intrinsically higher roughness compared to that of the interfacial side, i.e. toward the temporary substrate, in case of a polished temporary substrate. Micro-roughness can be described by two parameters, e.g. top-angle and amplitude, or characteristic length scale and height, and determined using known techniques such as atomic force microscopy (AFM). It is known in the art that for a polished temporary substrate the roughness can be limited to well below 5 nm (rms=root mean square), while standard commercial metal foil can be obtained with rms roughness between 10 and 20 nm. This is considerably less than the roughness of the as-deposited transparent conductive oxide surface, which spans at least several tens of nanometers depending on the crystal structure (which in turn can be influenced by the deposition conditions).

As the morphology of the transparent oxide is characterized by a "rough" and a "smooth" side, due to the deposition process, the "rough" side in the layered transparent material obtained using the method according to the invention is facing the transparent carrier and not the external surface of the said layered material. Consequently, the "smooth" side of the transparent oxide faces the external surface of the layered transparent material. Two advantages are obvious to the person skilled in the art: the "rough" surface, having a larger surface area per unit square, may lead to better adhesion to the carrier foil (or adhesive, or precursor) if suitable lamination conditions are selected, while the "smooth" surface offers a contiguous, closed and relatively "flat" surface which is desirable for many applications involving subsequent manufacturing into an end-use product. For example, optical light scattering is dominated by roughness and the refractive index difference at both sides of the interface. The refractive index difference between the transparent oxide and air (external surface) is higher than between the oxide and the carrier or adhesive (internal interface) and hence the optical light scattering of the transparent layered material is lower in the "upside down" geometry using the method according to the invention than if a "conventional" deposition process is used (if at all possible considering the nature of the carrier material). Also, for transparent conductive oxide materials in electronic applications such as (flexible) displays, a smooth and flat "closed" surface structure strongly determines the electronic performance of the device, e.g. for OLED-based systems.

Therefore, the method according to the invention is particularly advantageous for manufacturing transparent layered materials in which requirements such as optical scattering, electrical and mechanical performance are stringent, e.g. for (flexible) flat panel, lightweight and robust display (i.e. pixellated) and lighting (i.e. non-pixellated, e.g. segmented) applications.

For instance, aluminum foils can be used as temporary substrate for the deposition of a tin oxide layer using an atmospheric pressure chemical vapor deposition process. This deposition process is well-suited for roll-to-roll application purposes. By combining two temporary substrates on which a transparent oxide is deposited in this way, and subsequently thermally laminating the layered systems with a transparent polymer foil a system comprising, from top to bottom, a temporary aluminum substrate, a tin oxide layer, (optionally) an adhesive layer, a PET layer, (optionally) an adhesive layer, a tin oxide layer, and an aluminum temporary substrate layer is obtained. The aluminum layers can be removed by wet etching with an aqueous NaOH solution. Both lamination and etching process steps can be carried out in a roll-to-roll process.

The transparent layered material thus obtained can be combined with e.g. a polymer adhesive layer on one side for lamination onto glass substrates. Using a well-chosen oxide layer on the other side, e.g. a titania antidust layer, the resulting material can be used to cover windows as heat-isolating material.

Alternatively, if a fluorine-doped tin oxide layer is deposited on one of the temporary metal substrates via chemical vapor deposition, a highly conductive transparent oxide can be obtained. By combining this oxide in a lamination process with a silicon oxide layer, obtained by chemical vapor deposition or sputtering as the case may be, on both sides of a transparent polymer foil, e.g. thermally stabilized polyethylene terephthalate (PET) foil, a transparent layered material is obtained comprising, from top to bottom, a temporary aluminum substrate, an F-doped tin oxide layer, an adhesive layer, a PET layer, a silicon oxide layer, and an aluminum temporary substrate layer. The aluminum layers can be removed by wet chemical etching and the F-doped tin oxide layer can be patterned using a laser. Mechanical or chemical patterning techniques can be envisaged as well. The resulting material is suitable for use in electronic applications, e.g., as transparent front panel for flat panel displays. The envisaged product is flexible, thus allowing for flat panel displays which are unbreakable and have intrinsic flexibility.

This flexibility can be demonstrated numerically as follows. A PET film of e.g. 100 micrometer thickness is covered on both sides with a transparent conductive oxide layer with thickness $d=0.7$ μm, which was applied onto the PET film under 0.5% compression (by previous high temperature oxide deposition on a metal temporary substrate). If this transparent layered material is bent, the strain in outer (tensile) oxide film is given by $eps=+d/2R_{curv}$ where $R_{curv}$ is the radius of curvature of the bent system. Suppose $R_{curv}=0.01$ m, then: $eps=50.10^{-6}/10^{-2}=5.10^{-3}=0.5\%$ implying that net strain in bended situation is 0% in the outer layer, and −1% (i.e. compression) in the inner layer. This is calculated using standard methods known to the artisan. A flexible mechanically compensated stack of such layers has the property that even for inorganic brittle oxide thin films a flexible and repeatedly bendable device can be produced in a commercially attractive way, e.g. by means of a roll-to-roll process. This system will effectively reduce initiation of cracks which in turn leads to deterioration of electric properties. Moreover, the use of an adhesive between the PET film and the oxide layer will tend to limit delamination phenomena, as mentioned above.

The present invention is illustrated in the following non-limitative figure.

FIG. 1 shows a schematic device according to the invention.

The device shows a transparent carrier foil 1, at least partly covered on both sides with a transparent oxide layer 2, optionally with an adhesive 3 between one or both transparent oxide layers 2 and the transparent carrier foil 1. The transparent oxide layer 2 is deposited on a temporary substrate 4. On one or both of these temporary substrates 4 an additional layer 5 can be deposited for added functionality. Optionally, the relative positions of transparent oxide layer 2 and additional layer 5 can be interchanged. In the method according to the invention, the temporary substrates 4 can be removed from the transparent layered material, which is thus composed of the transparent carrier 1, sandwiched between two transparent oxide layers 2 for mechanical compensation, optionally with one or two adhesive layers 3 and/or additional functionality layers 5. Note that the relative dimensions of FIG. 1 are not related to actual dimensions of the layered material.

The invention claimed is:

1. A method for preparing a layered material comprising a transparent polymer foil carrier both sides of which are at least partly covered with one or more layers, the one or more layers comprising at least one layer of a transparent inorganic material in a compressive state, the method comprising the consecutive steps of:
b) applying a transparent inorganic material layer over each of two temporary substrates of a metal or metal alloy foil at a temperature over 250° C., wherein the transparent inorganic material layers have a thermal expansion coefficient below a thermal expansion coefficient of the two temporary substrates;
c) providing the transparent polymer foil carrier sandwiched between the transparent inorganic material layers on the two substrates,
wherein, after cooling, the difference between the thermal expansion coefficient of the transparent inorganic material layers and the thermal expansion coefficient of the two temporary substrates results in a compressive state of the transparent inorganic material layers
and wherein the one or more layers at both sides of the transparent polymer foil carrier mutually compensate mechanical stresses in the transparent polymer foil carrier induced by the compressive state;
d) removing the temporary substrates.

2. The method according to claim 1 wherein before step b) at least one additional layer is applied onto at least one of the two temporary substrates.

3. The method according to claim 2, wherein the additional layer is a layer for adding an improvement to the layered material in at least one of the properties selected from the group consisting of optical, mechanical, chemical, and electrical properties.

4. The method according to claim 1, wherein between steps b) and c) at least one adhesive layer is applied onto the inorganic material layer of at least one of the temporary substrates.

5. The method according to claim 1, wherein the inorganic material is crystalline oxide.

6. The method according to claim 5 wherein at least one of the transparent oxide layers is electrically conductive.

7. The method according to claim 6 wherein the transparent oxide layer is a fluoro-doped tin oxide.

8. The method according to claim 5 wherein step b) is performed by chemical vapor deposition at a temperature of at least 400° C. to obtain an electrical conductivity of the transparent oxide layer giving a sheet resistance below 40 Ohms/square while simultaneously the reduction in the transmission for optical wavelengths between 390 nm and 650 nm is less than 15% of the transmission of the transparent carrier foil.

9. The method according to claim 8 wherein an electrical conductivity of the transparent inorganic material layer is obtained giving a transparent conductive oxide layer having an average size of the crystallites in the 180 to 220 nm range and a sheet resistance below 10 Ohms/square.

10. The method according to claim 1, wherein at least one of the transparent inorganic material layers has a patterned structure.

11. The method according to claim 1, wherein the transparent carrier layer and the transparent inorganic material layers are combined by lamination.

12. The method according to claim 1, wherein step c) is performed in one step.

13. The method according to claim 1, wherein a polymerizable precursor for a transparent polymerized carrier is provided between the two transparent inorganic material layers, followed by polymerizing the polymerizable precursor to form the transparent carrier.

14. The method according to claim 13, wherein between steps a) and b) at least one additional layer is applied onto at least one of the temporary substrates.

15. The method according to claim 13, wherein the inorganic material is crystalline oxide and step b) is performed by chemical vapor deposition at a temperature of at least 400° C. to obtain an electrical conductivity of the transparent oxide layer giving a sheet resistance below 40 Ohms/square while simultaneously the reduction in the transmission for optical wavelengths between 390 nm and 650 nm is less than 15% of the transmission of the transparent carrier foil.

* * * * *